United States Patent [19]

Gergis et al.

[11] 4,424,577

[45] Jan. 3, 1984

[54] CONDUCTORLESS BUBBLE DOMAIN SWITCH

[75] Inventors: Isoris S. Gergis, Yorba Linda; Bruce E. MacNeal, Fullerton, both of Calif.

[73] Assignee: Rockwell International Corporation, El Segundo, Calif.

[21] Appl. No.: 170,462

[22] Filed: Jul. 21, 1980

[51] Int. Cl.³ ............................................. G11C 19/08
[52] U.S. Cl. ......................................... 365/36; 365/15; 365/41
[58] Field of Search ................... 365/15, 16, 17, 36, 365/41

[56] References Cited

U.S. PATENT DOCUMENTS

| | | | |
|---|---|---|---|
| 4,142,250 | 2/1979 | Keete et al. | 365/36 |
| 4,157,591 | 6/1979 | Dekker et al. | 365/36 |
| 4,249,249 | 2/1981 | Bonyhard et al. | 365/36 |
| 4,283,776 | 8/1981 | Nelson. | |

OTHER PUBLICATIONS

Nelson et al., 1980 IEEE, Bell Laboratories, "Ion-Implanted Bubble Circuit Function Design (Invited)".

Primary Examiner—James W. Moffitt
Attorney, Agent, or Firm—H. Fredrick Hamann; Daniel R. McGlynn

[57] ABSTRACT

A magnetic bubble domain system including a planar layer of magnetic material in which magnetic bubble domains can be propagated; and first and second bubble domain guide structure coupled to the layer and defining respective first and second bubble propagation paths for guiding the movement of bubbles in the layer in response to a cyclical change in the orientation of a reorienting magnetic field within the plane of the layer. A transfer bubble domain guide structure coupled to the layer is also provided for transferring bubble domains between the first and the second propagation paths responsive to a reverse in direction of the reorienting magnetic field. The transfer path is substantially the same as one of the directions of the crystallographic axes of the planar layer.

36 Claims, 14 Drawing Figures

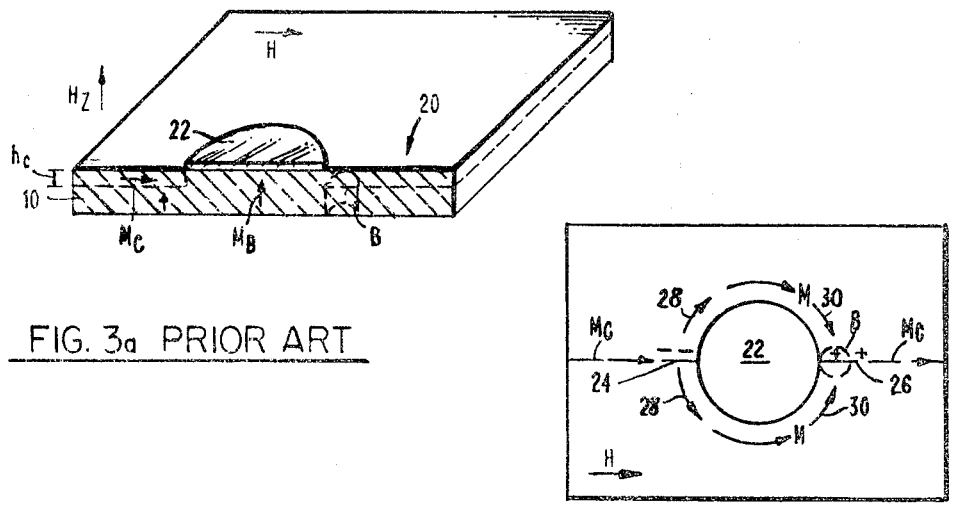
FIG. 3a PRIOR ART
FIG. 3b PRIOR ART
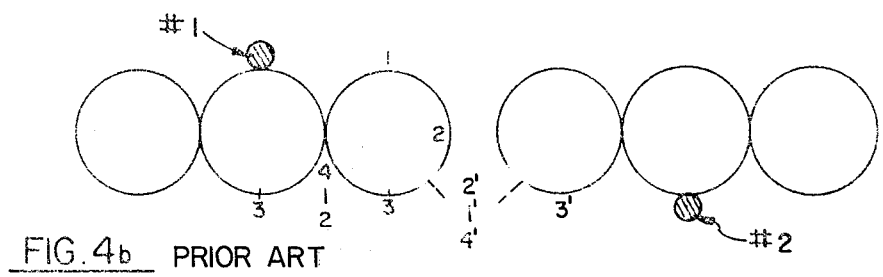
FIG. 4b PRIOR ART
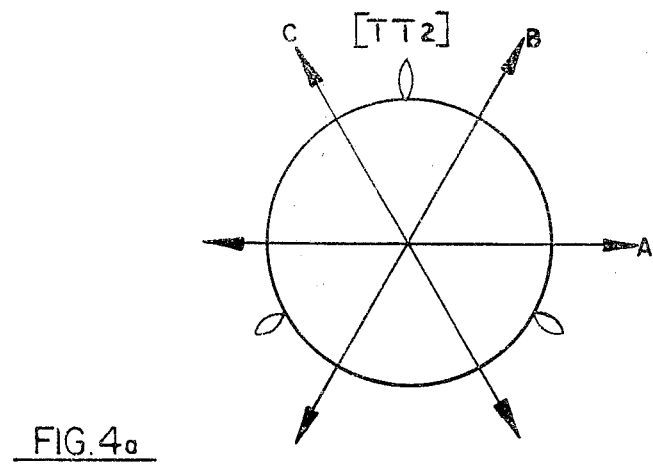
FIG. 4a

CONDUCTORLESS BUBBLE DOMAIN SWITCH

TECHNICAL FIELD OF THE INVENTION

The invention relates to magnetic bubble domain devices and in particular to bubble domain switches for transferring bubbles between different propagation paths.

BACKGROUND OF THE INVENTION

Magnetic bubble domain devices are well known in the art. The most familiar mode of operating a magnetic bubble device is termed the "field-access" mode. In this mode, a pattern of magnetically soft elements (such as Permalloy or ion implanted contiguous disks) is formed in a plane adjacent a layer of material in which the bubbles are moved. A magnetic field is generated in the plane of the layer and the field caused to reorient to incrementally-offset radial positions cyclically in the plane. Each element is so shaped that various portions thereof respond to the in-plane field to generate pole-patterns which change as the field precesses. The configuration of adjacent elements sets up a sequence of travelling potential wells in the layer which causes bubble movement.

Various types of magnetic bubble domain device architectures are known in the prior art, including the major loop/minor loop configuration. The major loop/minor loop configuration, such as described in U.S. Pat. No. 3,618,054, consists of a plurality of first recirculating "minor" channels and a second "major" channel.

In most bubble domain memory organizations, and particularly in the well known major/minor loop organization, a transfer switch is required for transferring bubble domains from one propagation path to another. Where contiguous propagation elements are used for the major and minor loops, the transfer switch is typically a wide conductor bridging the major loop propagation path and the various minor loop propagation paths. However, wide conductors, and other types of transfer gates, do not have transfer margins which are as great as the margins obtained for bubble propagation along a shift register. Since the operating margin of the complete memory depends upon the operating margins of its individual components, the transfer gate operation is a very critical one.

SUMMARY OF THE INVENTION

Briefly, and in general terms, the invention provides a magnetic bubble domain system including a planar layer of magnetic material in which magnetic bubble domains can be propagated; a bubble domain guide structure coupled to the layer for guiding the movement of bubbles in the layer; said guide structure being organized into a major loop and a plurality of minor loops suitably positioned for transfer of domains between the major loop and respective ones of the minor loops; and transfer means disposed between the major loop and a respective one of the minor loops for transferring bubble domains therebetween. More particularly, in the present invention, the transfer means are disposed with respect to the major loop and one of the minor loops such that the direction of a bubble domain transfer path between the one minor loop and the major loop is substantially the same direction as one of the crystallographic axes of the planar layer. The transfer means are moreover operative to transfer bubble domains in response to a reverse in the sense of rotation of the reorienting magnetic field. The transfer means are preferably defined by a structure which comprises an ionimplanted portion of the planar layer of magnetic material disposed between said first and second propagation paths and spaced apart therefrom. In one embodiment, the transfer structure comprises a single disk shaped element.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIGS. 3a and 3b are cross-sectional views of a magnetic bubble domain device which has been ion implanted.

FIG. 4a is a schematic diagram showing the easy directions of magnetization similar to that in FIG. 2.

FIG. 4b is a top plan view of a bubble domain device to illustrate how a bubble will propagate.

DESCRIPTION OF PREFERRED EMBODIMENT

The present invention is concerned with a switching mechanism in an ion implanted magnetic bubble domain device. In order to understand the mechanism according to the present invention, reference must first be made to the easy magnetization directions and the corresponding stable bubble positions in a magnetic bubble domain device having substantially disc shaped propagation elements.

Figure 1A:
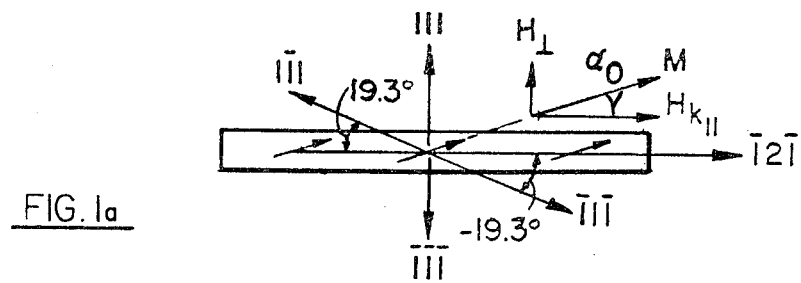
FIG. 1(a) is a cross section of implanted garnet film along [121] direction showing magnetization angle $\alpha_o$ deviating from film plane.
Figure 1B:
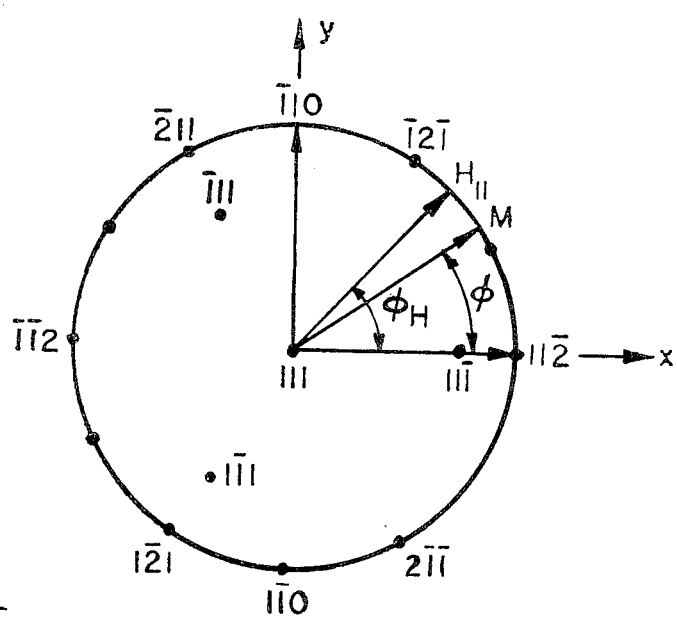
FIG. 1(b) is a sterographic projection of the (111) plane showing the two angles $\phi$ and $\phi_H$ in relation to the crystalline axes.

Turning first to FIGS. 1a and 1b there is shown a cross section of implanted garnet film along [121] direction showing magnetization angle $\alpha_o$ deviating from film plane and a sterographic projection of the (111) plane showing the two angles $\phi$ and $\phi_H$ in relation to the crystalline axes.

The magnetization pull-down mechanism in the implanted areas of an ion implanted magnetic bubble domain device has been explained as being due to the conversion of easy-axis magnetization from perpendicular to parallel to the film plane by an implantation-induced stress anisotropy energy $K_i$. To maximize the charged wall effect, the magnetization orientation should lie as close to the film plane as possible. A rigorous analysis of the magnetization distribution requires knowing the implantation damaged profile which determines the amplitude of $K_i$. To facilitate the analysis, we consider the implanted layer in a "single domain" with a magnetization orientation described by an azimuthal angle $\phi$ and a complement polar angle $\alpha$. By designating the [112] and [110] directions as the x and y axes respectively (see FIG. 1b), the total energy density E of the system can be expressed as:

$$E = K_u \cos^2\alpha + K_i \sin^2\alpha + 2\pi M^2 \sin^2\alpha - MH_\perp \sin\alpha - \quad (1)$$

$$MH_\parallel \cos\alpha \cos(\phi_H - \phi) - |K_1|(\tfrac{1}{3}\cos^4\alpha + \tfrac{1}{3}\sin^4\alpha +$$

$$\sqrt{\tfrac{2}{3}} \cos^3\alpha \sin\alpha \cos 3\phi)$$

where $H_\perp$ and $H_\parallel$ are bias field and in-plane field; $K_u$, $K_i$ and $K_l$ are uniaxial anisotropy, implantation-induced anisotropy, and crystalline anisotropy energy constant, respectively; $\phi_H$ is the azimuthal angle of in-plane field $H_\parallel (H_\parallel = i_x H_x + i_y H_y)$ measured counterclockwisely from the x-axis (see FIG. 1b).

The stable magnetization orientations $\phi$ and $\alpha$ are obtained by minimizing the total energy $\delta E = 0$, which reduced to a pair of equations as:

$$\partial E/\partial \phi = 0 \text{ and } \partial^2 E/\partial \phi^2 > 0, \quad (2)$$

and $\partial E/\partial \alpha = 0$ and $\partial^2 E/\partial \alpha^2 > 0$ (3)

In the special case of $Gd_1Y_1Tm_1Ga_{0.4}IG$ garnet (with $4\pi M = 600$ G, $K_u = 15,000$ erg/cm$^3$, $K_{i\pi} 30,000$ erg/cm$^3$ and $K_1 = 5,000$ erg/cm$^3$), the variation angle $\alpha$ is small (12° −17°). Thus the magnetization rotational behavior can be simplified by solving Eq. (2) only with a constant angle $\alpha(= 14.5°$ in the following calculations). The stable azimuthal angle $\phi$ is then determined by minimizing the last two energy terms in Eq. (1); i.e., the crystalline anisotropy energy and the magnetic in-plane field energy. Examine the 3-fold crystalline anisotropy terms of Eq. (1) readily reveals that: (i) If $\alpha > 0$ (i.e., $H_\perp$ points upwardly as sketched in FIG. 1a), the crystalline anisotropy energy term reaches minimum for three values of $\phi$ at 0°, 120° and 240°, so that the three crystalline axes [112], [211] and [121] are "easy" directions of the magnetization; whereas the anisotropy energy reaches maximum for the opposite directions (i.e., $\phi = 60°$, 180° and 300°, see FIG. 1b). (ii) If $\alpha < 0$ by reversing the bias field $H_\perp$, then the angle $\phi$ for the three minimum and maximum energy states as well as the three easy magnetization directions are reversed.

Figures 2A, 2B:
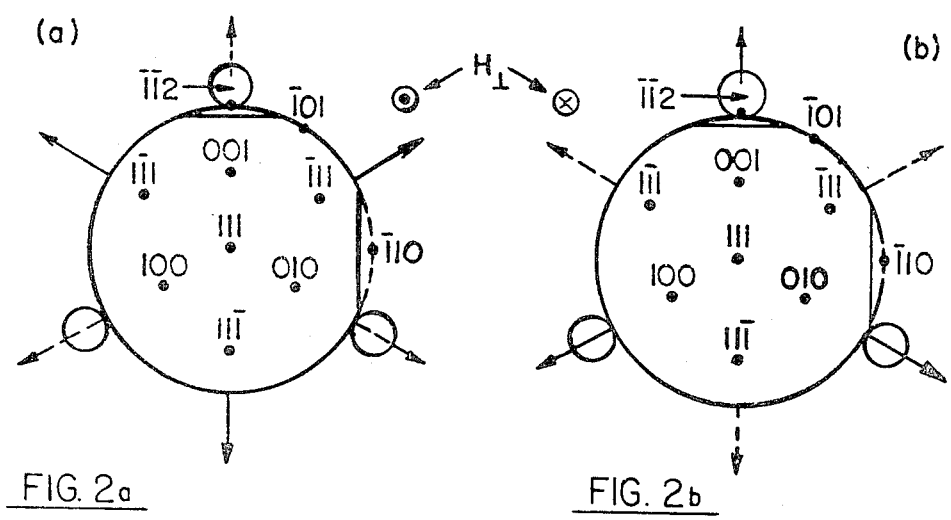
FIGS. 2a and 2b are schematic explanations of three easy magnetization directions (solid arrows); three favorable in-plane field directions for forming charged walls (dashed arrows); and three easy bubble stripeout directions around a disk (small circles on the perimeter of the disk).

As the bias field is reversed one observes identical whip and flip motions for both attractive and repulsive charged walls as well as the associated bubble's easy stripe-out positions around the disk but at opposite in-plane field direction. This complex but important relationship perhaps can be better explained in FIGS. 2a and 2b schematically. (Notice the crystalline axes of FIGS. 2a and 2b are 90° in the clockwise direction from the coordinates used in FIG. 1b). The information contained in FIGS. 2a and 2b can be appreciated following these three steps: (1) The three solid arrows are easy magnetization directions where a minimum crystalline anisotropy energy is attached. (2) The three dashed arrows pointing toward the critical curve's three vertexes are the in-plane field directions when both attractive and repulsive charged walls go through the whip motion. (3) The three open circles are stable bubble positions (or easy bubble stripe-out positions) where the attractive charged wall is located, while the repulsive charged wall is located at the opposite side of the disk. Summing them up, as a result of reversing the bias field, the three easy magnetization directions are reversed so that the three positions for forming the converging-/diverging walls around a disk are also reversed, resulting in three identical stable bubble positions since the polarities for bubble and the attractive charged wall are also reversed.

FIG. 3a is a cross-sectional view of a magnetic bubble domain material 10 which has been ion implanted in the surface regions 20 surrounding the ion implantation mask 22. Mask 22 is comprised of a material which will prevent the bombardment of the bubble material 10 by the incoming ions and could be, for instance, a layer of gold. The magnetization $M_\beta$ of the bubble material is normal to the film plane, while the magnetization $M_c$ of the ion implanted areas is in the plane of layer 10. For purposes of illustration, a bubble domain B is shown in layer 10. The magnetic field H used to drive domains is directed to the right in this drawing (i.e., at the instant of time represented by this figure).

FIG. 3b shows the magnetization direction in the ion implanted region 20 when magnetic field H is applied in the direction indicated. The magnetization $M_c$ diverges and flows around the nonimplanted region of the bubble material under mask 22 in a manner similar to that of a slow stream of water flowing around a boulder in the stream. This forms a diverging wall 24 upstream and a converging wall 26 downstream. That is, the magnetization vectors 28 are directed oppositely to each other to form the divergent wall, while the magnetization vectors 30 are directed toward one another to form the converging wall 26. In accordance with the reference standard chosen, the converging wall is indicated by the plus (+) signs.

For bubble domains with down magnetization as indicated in FIG. 3a, the plus charged wall 26 is attractive to them. This converging wall has magnetic flux associated with it which is directed downwardly in a direction parallel to the magnetization of the bubble domain. Therefore, it is energetically attractive for the bubble domains and the bubble domain will stay at the charged wall to which it is coupled. Of course, if the magnetization of the bubble domain were in the opposite direction (up) then the bubble domain would be attracted to and coupled to the divergent wall 24.

Switching capability in ion implanted devices requires that the potential well experienced by a bubble be selectively altered in order to redirect the bubble along an alternate propagation path. In prior art permalloy devices, switching is done with current-carrying conductors. The present invention teaches that switching can be accomplished in ion implanted devices by combining the three-fold symmetry found in [111] bubble materials with a selective reversal of the rotation direction of the in-plane field.

The merge function shown in FIG. 4b illustrates the switching function as known in the prior art. The device design was first introduced by Bell Labs at the ICMB-3 conference in March, 1979. The operation is as follows: Assume that the bubble is initially at position #1 with the in-plane field in the 1-direction. A 360° clockwise (cw) rotation of the field (sequence, 12341)

moves the bubble to the right by one bit. During the following 180° of rotation (23), the bubble moves through the gap to the bottom of the end disk. When the direction of rotation is reversed, the bubble does not return along the original (cw) path, but moves along the path (2'1'4'3' ... ) to position #2. For merging to occur, the loops must be oriented in the A, B, or C directions relative to the crystal axes (see FIG. 1B). The bubble will stay on the right loop only if the field rotates in the counterclockwise direction, so that this merge gate by itself does not provide a switching function. Switching can be achieved by combining two or more different merge gates with a temporary reversal of the rotating field. This switching method has three advantages over present techniques: (1) the switching circuitry (conductors) are eliminated, thus simplifying the chip design; (2) the external drive circuitry for the conductors is no longer needed; and (3) the switch does not dissipate power on the chip, thus preventing over-heating.

Figure 5:
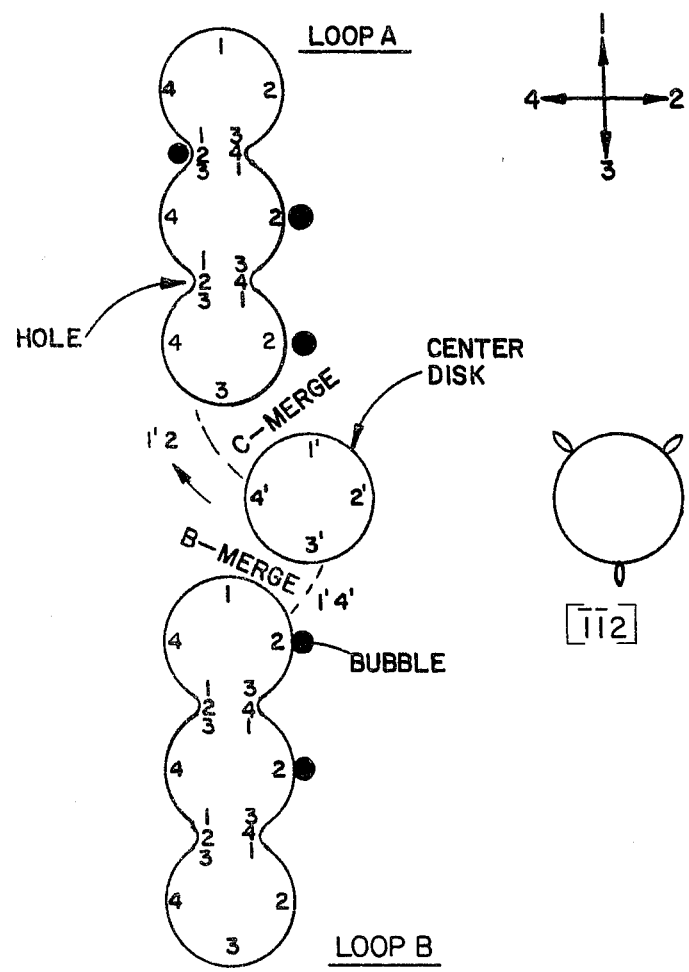
FIG. 5 is a top plan view of a first embodiment of a bubble switch according to the present invention.

A simple conductorless switch design according to the present invention is shown in FIG. 5.

Assuming that the field normally rotates clockwise, the bubbles in both loops A and B circulate in the clockwise direction. A bubble which is labelled "BUBBLE" in FIG. 5 in loop B can be switched into loop A by first moving the bubble and "hole" (representing the absence of a bubble at a position where a bubble representing a bit normally is positioned) which is labelled "HOLE" in loop A into the positions indicated. Then the field is reversed for 540° of counterclockwise rotation (2'1'4'3'2'1'4'). The bubble moves across the B-merge gate to the left side of the center disk. At the same time, the hole moves across the C-merge gate to the same position. When clockwise rotation is resumed, the bubble moves across the C-merge gate and takes its proper place in loop A. By making loops A and B parts of major and/or minor loops, transfer-in and transfer-out functions can be achieved.

The numerals 1, 2, 3, and 4 refer to the bubble locations on the ion implanted pattern at specific time instants which correspond to the time instant when the rotating in-plane field is oriented in the directions designated 1, 2, 3, and 4 as indicated in FIG. 5, i.e., 1 is the up direction, 2 is to the right, etc.

In a track such as Loop A which is oriented relative to the crystal axes as shown in FIG. 5, these bubble locations are: for orientation 1, bubbles can exist at the locations designated by "1" in the Figure, i.e. at the top of the upper disk, as well as on all the cusps; for orientation 2, the locations are the right-most edges of the disks on the right hand side of the track, and at the cusps on the left hand side of the track, as shown by locations designated by "2", etc. Bubbles stay at the cusps for more than 180° of the field cycles, and thus for example the right-hand side cusps in Loop A are labelled "3 4 1" since a bubble stays at the cusp during field positions 3,4, and 1, and does not move until field position 2.

The designated locations are not unique when considering clockwise (CW) and counter clockwise (CCW) rotations, except possibly for isolated single tracks. For example, in loop B a bubble propagating under CW rotation along the left hand side of the track will end up in location 1 at the top of the upper disk, while if it was propagating on the right hand side of Loop B under CCW rotation it will end up in the location marked 1'4' (merge B), which straddles Loop B and the center disk. The bubble will actually stay at the merge B position until the field reaches beyond orientation 4. The narrow spacing between the disks acts as a virtual cusp.

To give a one to one correspondence between the field orientation and bubble location the merge B location is denoted as corresponding to the CCW positions "1', 2', ". The use of a primed numeral is used to denote a reversal of the rotating in-plane field from clockwise to counterclockwise. Thus "1 2 3 4 1" denotes a rotation of the field 360° in the clockwise direction. The sequence 1 2 3 2'1'4' denotes a rotation 180° in the clockwise direction (in-plane field positions 1, 2, 3), followed by a counter-clockwise rotation of 270° (in-field field positions 2 followed by 1 followed by 4, which we denote 2'1'4').

The numerals 1, 2, 3 refer to points not to intervals. The rotation from (2'1'4'3'2'1'4') corresponds to one and a half cycles i.e. 540°.

In a proper operation of bubble devices a bubble should be transferred to a vacant space (hole) and never to one already occupied by another bubble.

Figure 6:
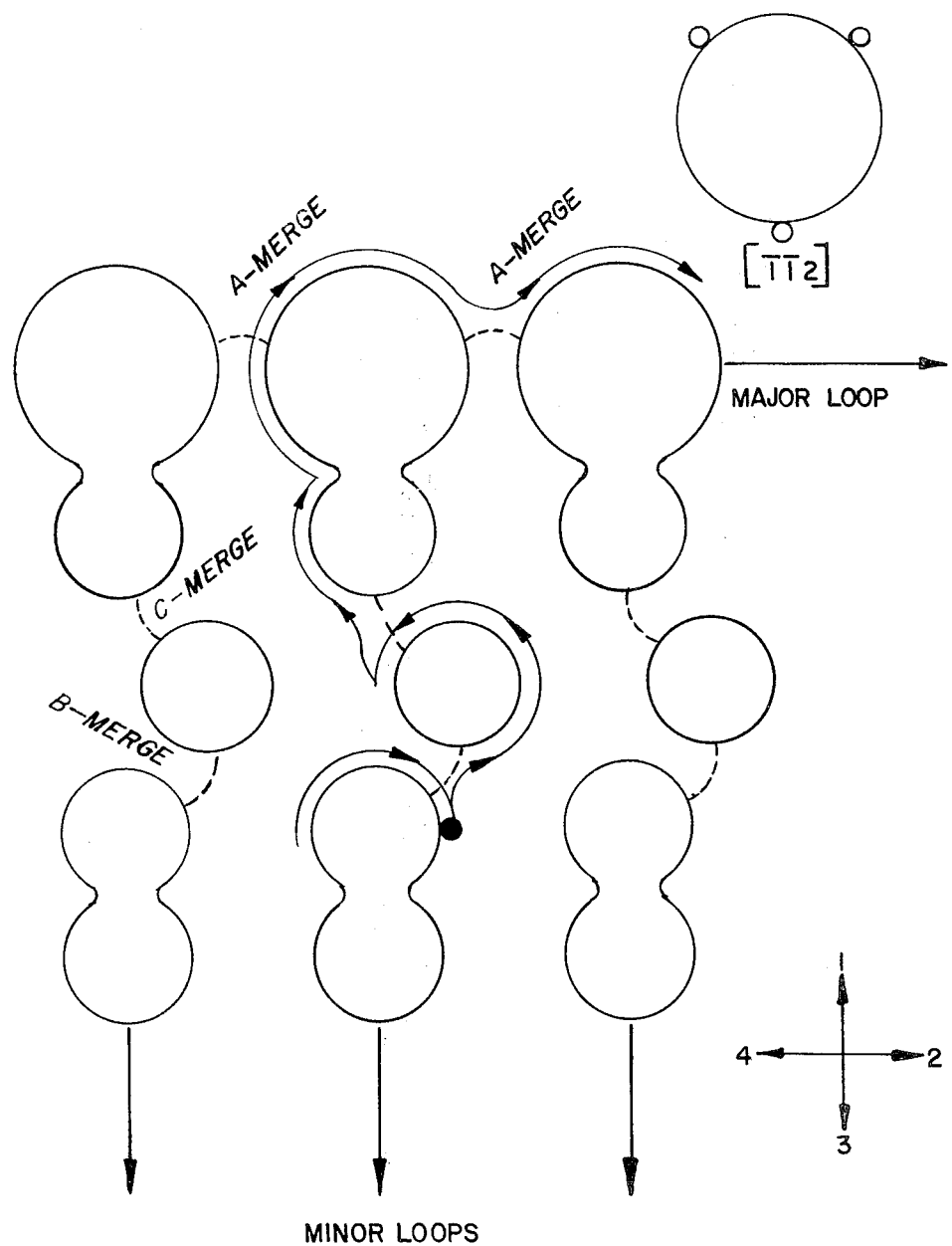
FIG. 6 is a top plan view of a second embodiment of a bubble switch according to the present invention.

The uses of this switching technique extend beyond simple transfer functions. FIG. 6 shows a topological transfer function using all three merge gates. Bubbles are simultaneously transferred out of the minor loops using the switch shown in FIG. 4b. When clockwise rotation resumes, the bubbles move onto the large major loop disks by passing through the A-merge gates. The bubbles then move to the right along the top of the major loop, and are transferred to the detector. Data restructuring can also be achieved by switching between minor loops.

Another embodiment of the present invention is the three-bubble two-way switch shown in FIGS. 7a, 7b and 8a, 8b, which makes use of a different geometry. The switch is designed to transfer three bubbles, rather than just one, in either direction between a major loop consisting of inside and outside corners, as in the Nelson design, and a conventional, collinear contiguous disk minor loop.

Since three bubbles are transferred, the design of the center element 20 is somewhat different from the other embodiments. It consists of a contiguous disk propagation path oriented parallel to the minor loop, but with different propagation periods on opposite sides 21 and 22 so that there are three tips on the left and five on the right. In general, if N bubbles are to be transferred, N tips must be on the left and 2N−1 must be on the right. It can be seen that the embodiment of FIGS. 5 and 6 using a single center disk is a special case of this more general design with N=1. Note that the ends of the center element meet the minor and major loops so as to form two different merge gates.

Figure 7A:
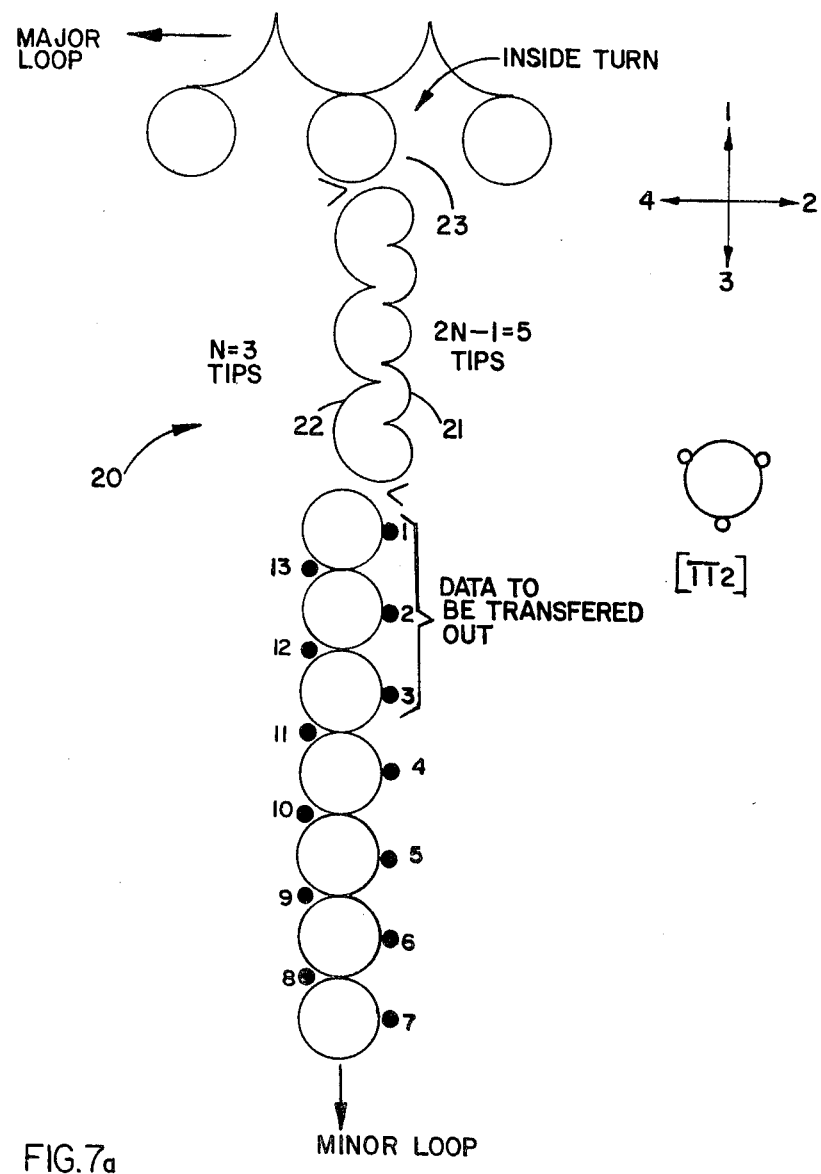
FIGS. 7a and 7b are top plan views of a third embodiment of the present invention during "transfer in" according to the present invention.
Figure 7B:
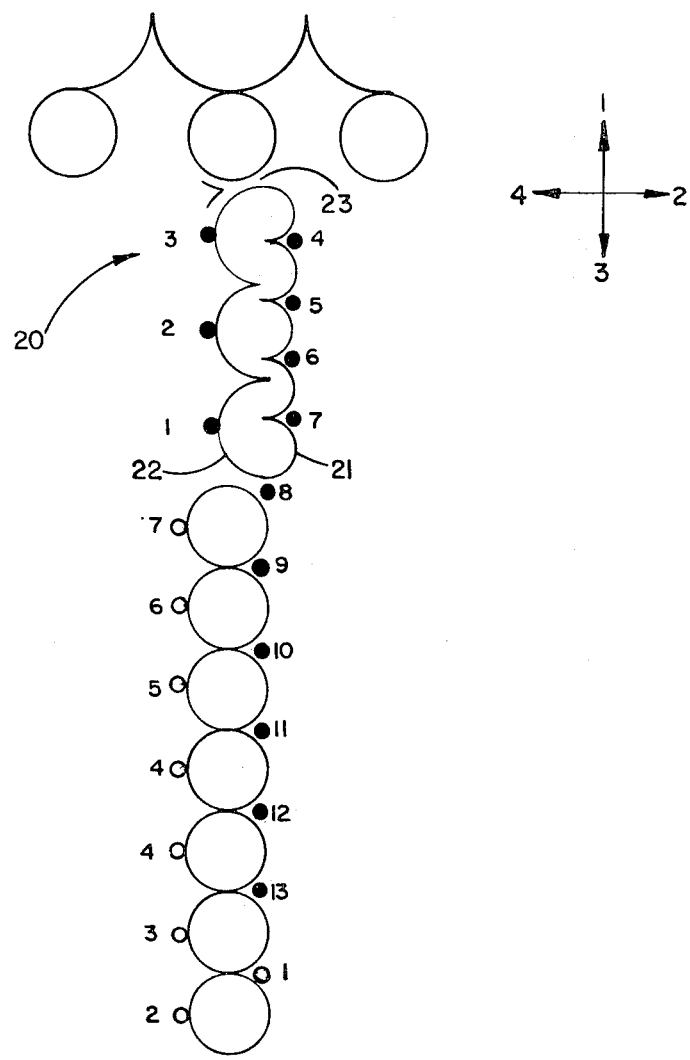

Transfer-out operation, such as for transferring bubbles from a minor loop to a major loop, is described in FIGS. 7a and 7b. In the initial position (FIG. 7a), the data to be transferred out (represented by heavy circles labelled 1, 2, and 3) is located at the top of the minor loop as shown, while the major loop is empty. Other data positions in the minor loop are also indicated (represented by a heavy circle "●"). After 7½ reverse rotations (CCW) of the external field, the bubbles assume the configuration shown in FIG. 8b. The transfer data is on the left side of the center element 20. When forward rotation is resumed, this data will cross the upper merge gate 23 and enter the major loop. Holes (bubble positions where there is no bubble present) left in the minor loop are indicated by a circle o. The bubbles remaining on the right side of the center element 20 will re-enter the minor loop and meet the five corresponding vacancies (labelled 1-, 2-, 3-, 4-, and 5-) without changing the pattern.

Figure 8A:
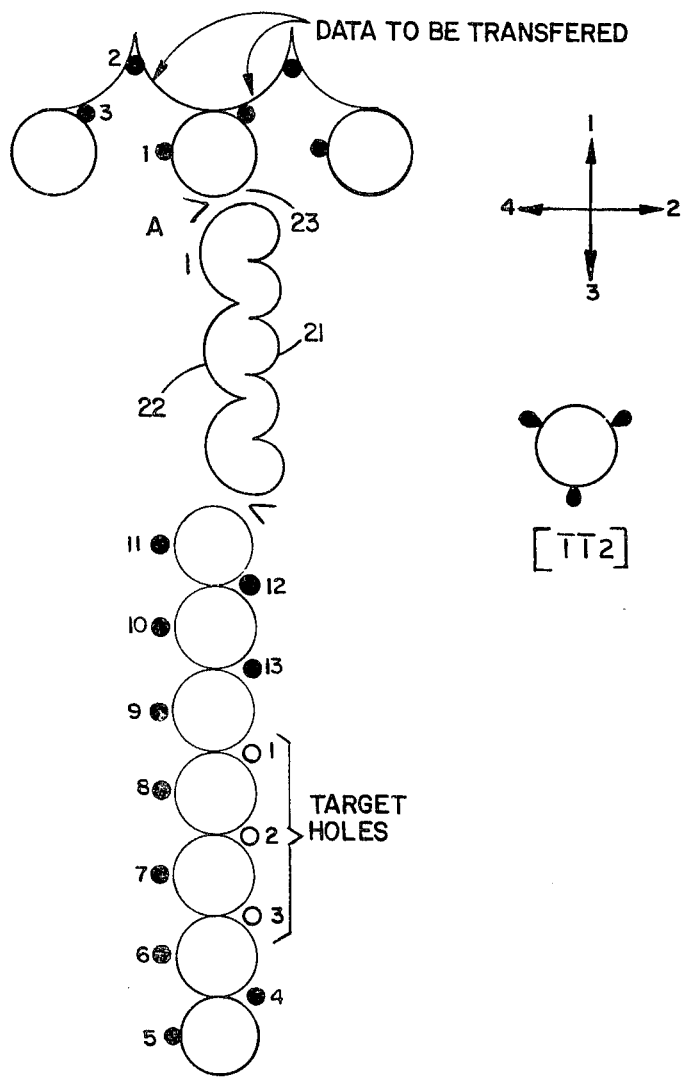
FIGS. 8a and 8b are top plan views of the third embodiment of the present invention during "transfer out" according to the present invention.
Figure 8B:
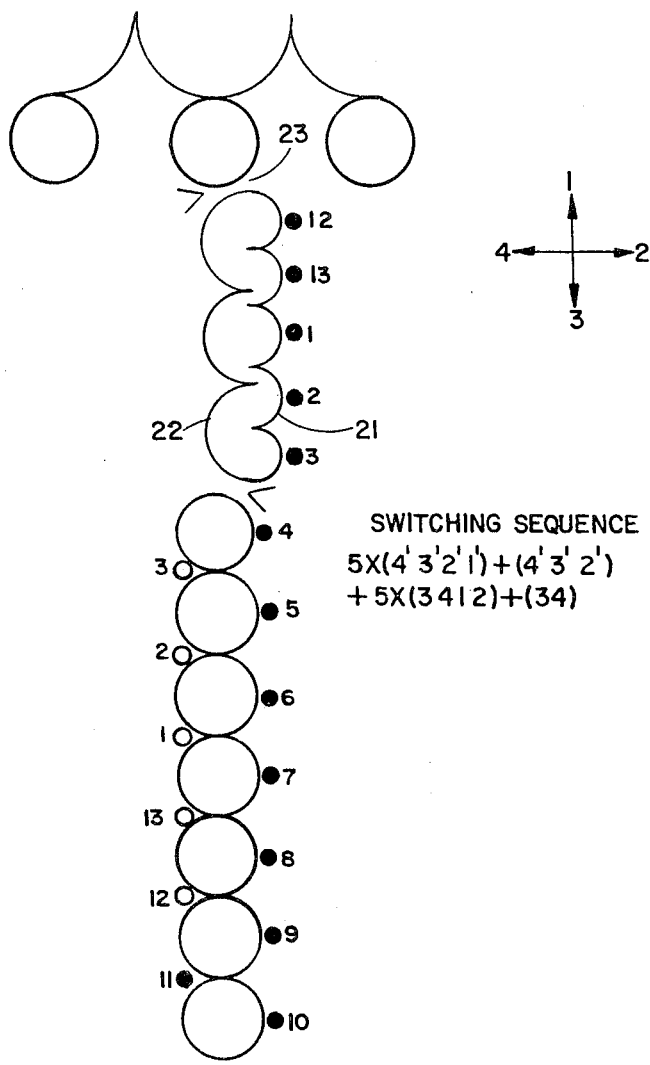

The transfer-out operation, such as for transferring bubbles from a major loop to a minor loop, is described in FIGS. 8a and 8b.

The initial position of the bubbles corresponding to data (•) and target holes (0) for transfer-in is shown in FIG. 8a. After 5½ reverse rotations, the bubbles have the configuration shown in FIG. 8b. The data meets the proper holes, and occupies the lower three tip positions on the right side 21 of the center element. The upper two positions (labelled "1" and "2") are occupied by unswitched minor loop data. When forward rotation resumes, all five data positions move back into the minor loop and fill the vacancies shown on the left side of the minor loop. In this way, the same structure can transfer three bubbles both into and out of the minor loop.

In addition to the embodiments using ion-implanted contiguous disks described above, the invention may also be implemented with a wide variety of element geometries. The prior art includes a number of more complicated ion-implanted propagation structures which can be used as either the first or second elements (major or minor loops). For example, Nelson et al, of Bell Labs recently described a major loop design composed of alternating inside and outside corners which may be useful (Intermag Conference, Boston, Mass. April 1980). Moreover the center element could be a propagation path of any length. An important feature of the configuration as taught by the present invention is that the two ends of the center element must meet the first and second propagation paths with the proper orientation relative to the crystal axes so as to form two merge gates with different orientations. The particular design of the three elements is arbitrary, and a matter of design choice.

While the invention has been illustrated and described as embodied in a conductorless bubble domain switch, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The composition, architecture and geometric configuration of the guide elements, and the layout and distance between the propagation paths, as well as the distance to the magnetic bubble guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover, the source, orientation, and frequency of the magnetic field, and the static or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A magnetic bubble domain system comprising:
    a planar layer of magnetic material in which magnetic bubble domains can be propagated;
    a bubble domain guide structure coupled to said layer for guiding the movement of said bubble domain in said layer; said guide structure being organized into a major loop and a plurality of minor loops suitably positioned for transfer of bubble domains between said major loop and respective ones of said minor loops; and transfer means disposed between said major loop and a respective one of said minor loops for transferring bubble domains therebetween;
    characterized in that said transfer means comprises a contiguous disk pattern element disposed with respect to said major loop and one of said minor loops such that the direction of a bubble domain transfer path between said one minor loop and said major loop is substantially the same direction as one of the crystallographic axes of said planar layer.

2. A system as defined in claim 1, wherein said minor loops are formed by a field access structure.

3. A system as defined in claim 2, wherein said field access structures comprise ion-implanted contiguous disks.

4. A system as defined in claim 1, wherein said major loops are formed by a field access structure.

5. A system as defined in claim 4, wherein said field access structure comprise ion-implanted contiguous disks.

6. A magnetic bubble domain device as defined in claim 1, wherein said contiguous disk pattern element comprises a series of overlapping collinear contiguous disks.

7. A magnetic bubble domain device as defined in claim 1, wherein one edge portion of said contiguous disk pattern element comprises a series of arcuate paths having a first radius, and a second edge portion of said contiguous disk pattern element comprising a series of arcuate edgeshaving a second smaller radius.

8. A magnetic bubble domain device as defined in claim 7, wherein said first and second edge portions are disposed diametrically opposed to one another.

9. A system as defined in claim 1, further comprising means coupled to said body for generating and controllably positioning magnetic domains in said magnetic material.

10. A magnetic bubble domain system comprising:
    a planar layer of magnetic material in which magnetic bubble domains can be propagated;
    a first bubble domain guide structure coupled to said layer and defining a first bubble propagation path for guiding the movement of said bubble domains in said layer in response to a cyclical change in the orientation of a reorienting magnetic field within the plane of said layer;
    a second bubble domain guide structure coupled to said layer and defining a second propagation path for guiding the movement of said bubble domains in said layer in response to a cyclical change in the orientation of a said reorienting magnetic field in the plane of said layer;

a transfer bubble domain guide structure coupled to said layer for transferring bubble domains between said first and said second propagation paths;

characterized in that said transfer guide structure comprises a single disk disposed with respect to said first guide structure and said second guide structure such that the direction of the bubble transfer path between said transfer guide structure and first and second guide structures is substantially the same as the crystal axes of said layer of magnetic material.

11. A system as defined in claim 10, wherein said first propagation path comprises a minor loop and said second propagation path comprises a major loop.

12. A system as defined in claim 10, wherein said first propagation path comprises ion-implanted contiguous disks.

13. A magnetic bubble domain system comprising:

a planar layer of magnetic material in which magnetic bubble domains can be propagated;

a first bubble domain guide structure coupled to said layer and defining a first bubble propagation path for guiding the movement of said bubbles in said layer in response to a cyclical change in the orientation of a reorienting magnetic field within the plane of said layer;

a second bubble domain guide structure coupled to said layer and defining a second propagation path for guiding the movement of said bubbles in said layer in response to a cyclical change in the orientation of a said reorienting magnetic field in the plane of said layer;

a transfer bubble guide structure coupled to said layer for transferring bubble domains between said first and said second propagation paths;

characterized in that said transfer guide structure comprises a contiguous disk pattern disposed with respect to said first guide structure and said second guide structure such that the direction of the bubble transfer path between said transfer guide structure and first and second guide structures is substantially the same as the crystal axes of said layer of magnetic material.

14. A magnetic bubble domain device as defined in claim 13, wherein said contiguous disk pattern comprises a series of overlapping collinear contiguous disks.

15. A magnetic bubble domain device as defined in claim 13, wherein one edge portion of said contiguous disk pattern comprises a series of arcuate paths having a first radius, and a second edge portion of said contiguous disk pattern comprising a series of arcuate edges having a second smaller radius.

16. A magnetic bubble domain device as defined in claim 15, wherein said first and second edge portions are disposed diametrically opposed to one another.

17. A system as defined in claim 13, further comprising means coupled to said body for generating and controllably positioning magnetic domains in said magnetic material.

18. A magnetic bubble domain system comprising:

a planar layer of magnetic material in which magnetic bubble domains can be propagated;

a first bubble domain guide structure coupled to said layer and defining a first bubble propagation path for guiding the movement of said bubble domains in said layer in response to a cyclical change in the orientation of a reorienting magnetic field within the plane of said layer;

a second bubble domain guide structure coupled to said layer and defining a second propagation path for guiding the movement of said bubbles in said layer in response to a cyclical change in the orientation of a said reorienting magnetic field in the plane of said layer;

a transfer bubble domain guide structure coupled to said layer for transferring bubble domains between said first and said second propagation paths;

characterized in that said transfer bubble domain guide structure is operative to transfer bubble domains in response to a reverse in direction of said reorienting magnetic field, followed by a return to the original direction of said reorienting magnetic field after a predetermined time.

19. A system as defined in claim 18, wherein said first propagation path comprises a minor loop and said second propagation path comprises a major loop.

20. A system as defined in claim 18, wherein said first propagation path comprises ion-implanted contiguous disks.

21. A magnetic bubble domain system comprising:

a planar layer of magnetic material in which magnetic bubble domains can be propagated;

a first bubble domain guide structure coupled to said layer and defining a first bubble propagation path for guiding the movement of said bubble domains in said layer in response to a cyclical change in the orientation or a reorienting field within the plane of said layer;

a second bubble domain guide structure coupled to said layer and defining a second propagation path for guiding the movement of said bubble domains in said layer in response to a cyclical change in the orientation of a said reorienting magnetic field in the plane of said layer;

a transfer bubble domain guide structure coupled to said layer for transferring bubble domains between said first and said second propagation paths;

characterized in that said transfer bubble domain guide structure comprises a single disk shaped element and is operative to transfer bubble domains in response to a reverse in direction of said reorienting magnetic field.

22. A magnetic bubble domain system comprising:

a planar layer of magnetic material in which magnetic bubble domains can be propagated;

a first bubble domain guide structure coupled to said layer and defining a first bubble propagation path for guiding the movement of said bubble domains in said layer in response to a cyclical change in the orientation or a reorienting field within the plane of said layer;

a second bubble domain guide structure coupled to said layer and defining a second propagation path for guiding the movement of said bubble domains in said layer in response to a cyclical change in the orientation of a said reorienting magnetic field in the plane of said layer;

a transfer bubble domain guide structure coupled to said layer for transferring bubble domains between said first and said second propagation paths;

characterized in that said transfer bubble domain guide structure comprises a contiguous disk pattern of elements and is operative to transfer bubble domains in response to a reverse in direction of said reorienting magnetic field.

23. A magnetic bubble domain device as defined in claim 22, wherein said contiguous disk pattern comprises a series of overlapping collinear contiguous disks.

24. A magnetic bubble domain device as defined in claim 23, wherein one edge portion of said contiguous disk pattern comprises a series of arcuate paths having a first radius, and a second edge portion of said contiguous disk pattern comprising a series of arcuate edges having a second smaller radius.

25. A magnetic bubble domain device as defined in claim 24, wherein said first and second edge portions are disposed diametrically opposed to one another.

26. A magnetic bubble domain system comprising:
a planar layer of magnetic material in which magnetic bubble domains can be propagated;
a first bubble domain guide structure coupled to said layer and defining a first bubble propagation path for guiding the movement of said bubble domains in said layer in response to a cyclical change in the orientation of a reorienting magnetic field within the plane of said layer;
a second bubble domain guide structure coupled to said layer and defining a second propagation path for guiding the movement of said bubble domains in said layer in response to a cyclical change in the orientation of a said reorienting magnetic field in the plane of said layer;
a transfer bubble domain guide structure coupled to said layer for transferring bubble domains between said first and said second propagation paths;
characterized in that said transfer structure comprises an ion-implanted portion of said planar layer of magnetic material disposed between said first and second propagation paths and spaced apart therefrom, and is activated to transfer bubble domains in response to a reversal in direction of said reorienting magnetic field.

27. A system as defined in claim 26, wherein said first propagation path comprises a minor loop and said second propagation path comprises a major loop.

28. A system as defined in claim 26, wherein said first propagation path comprises ion-implanted contiguous disks.

29. A magnetic bubble domain device as defined in claim 26, wherein said transfer guide structure comprises a single disk.

30. A magnetic bubble domain device as defined in claim 26, wherein said transfer guide structure comprises a contiguous disk pattern.

31. A magnetic bubble device as defined in claim 30, wherein said contiguous disk pattern comprises a series of overlapping collinear contiguous disks.

32. A magnetic bubble domain device as defined in claim 30, wherein one edge portion of said contiguous disk pattern comprises a series of arcuate paths having a first radius, and a second edge portion of said contiguous disk pattern comprising a series of arcuate edges having a second smaller radius.

33. A magnetic bubble domain device as defined in claim 31, wherein said first and second edge portions are disposed diametrically opposed to one another.

34. A magnetic bubble domain system comprising:
a planar layer of magnetic material in which magnetic bubble domains can be propagated;
a first bubble domain guide structure coupled to said layer and defining a first bubble propagation path for guiding the movement of said bubble domains in said layer in response to a cyclical change in the orientation of a reorienting magnetic field within the plane of said layer;
a second bubble domain guide structure coupled to said layer and defining a second propagation path for guiding the movement of said bubble domains in said layer in response to a cyclical change in the orientation of a said reorienting magnetic field in the plane of said layer;
a transfer bubble domain guide structure coupled to said layer for transferring bubble domains between said first and said second propagation paths; and
characterized in that said transfer structure comprises an ion-implanted portion of said planar layer of magnetic material disposed as a contiguous disk pattern between said first and second propagation paths and spaced apart therefrom.

35. A magnetic bubble domain system comprising:
a planar layer of magnetic material in which magnetic bubble domains can be propagated;
a bubble domain guide structure composed of a first guide structure forming a major loop and comprising distinct spaced apart ion-implanted elements, each element formed from two overlapping disk shaped sub-elements of different radaii, the centers to the two disk shaped sub-elements being aligned in a direction substantially perpendicular to the path of bubble domain propagation, coupled to said layer for guiding the movement of said bubble domain in said layer; characterized in that the centers of said disk-shaped elements are aligned in a predetermined direction relative to the crystallographic axes of said planar layer so that bubbles in said layer propagate from disk element to disk element in response to a cyclical change in the orientation of a reorienting magnetic field with the plane of said layer, and a second guide structure comprising a plurality of minor loops suitably positioned for transfer of bubble domains between said major loop and respective ones of said minor loops;
transfer means disposed between the smaller disk shaped sub-elements of one of said elements of said major loop and a respective one of said minor loops for transferring bubble domains therebetween; and
characterized in that said transfer means is a single disk and is disposed with respect to said major loop and one of said minor loops such that the direction of a bubble domain transfer path between said one minor loop and said major loops is in a predetermined direction with respect to the direction of the crystallographic axes of said planar layer.

36. A magnetic bubble domain system comprising:
a planar layer of magnetic material in which magnetic bubble domains can be propagated;
a first bubble domain guide structure coupled to said layer and defining a first bubble propagation path for guiding the movement of said bubble domains in said layer in response to a cyclical change in the orientation of a reorienting magnetic field within the plane of said layer;
a second bubble domain guide structure coupled to said layer and defining a second propagation path for guiding the movement of said bubble domains in said layer in response to a cyclical change in the orientation of a said reorienting magnetic field in the plane of said layer;

a transfer bubble domain guide structure coupled to said layer for transferring bubble domains between said first and second propagation paths;

characterized in that said transfer bubble domain guide structure comprises an ion-implanted portion of said planar layer of magnetic material disposed between said first and second propagation paths and spaced apart therefrom, and is disposed with respect to said first guide structure and said second guide structure such that the direction of the bubble transfer path between said transfer guide structure and first and second guide structures is substantially the same as the crystal axes of said layer of magnetic material.

* * * * *

UNITED STATES PATENT AND TRADEMARK OFFICE
CERTIFICATE OF CORRECTION

PATENT NO. : 4,424,577
DATED : January 3, 1984
INVENTOR(S) : Isoris S. Gergis et al It is certified that error appears in the above-identified patent and that said Letters Patent are hereby corrected as shown below:

In column 3, line 34, please delete "$K_{i\pi}$" and insert --$K_i\pi$--.

Signed and Sealed this

Tenth Day of July 1984

[SEAL]

Attest:

GERALD J. MOSSINGHOFF

Attesting Officer

Commissioner of Patents and Trademarks